United States Patent [19]
Dent et al.

[11] Patent Number: 5,937,015
[45] Date of Patent: *Aug. 10, 1999

[54] INTERFERENCE MITIGATION BY JOINT DECODING OF OVERLAPPED SIGNALS

[76] Inventors: Paul W. Dent, Pittsboro; Gregory E. Bottomley, Cary, both of N.C.

[ * ] Notice: This patent issued on a continued prosecution application filed under 37 CFR 1.53(d), and is subject to the twenty year patent term provisions of 35 U.S.C. 154(a)(2).

[21] Appl. No.: 08/710,537

[22] Filed: Sep. 19, 1996

Related U.S. Application Data

[63] Continuation-in-part of application No. 08/179,953, Jan. 11, 1994, Pat. No. 5,619,503, and a continuation-in-part of application No. 08/305,787, Sep. 14, 1994, Pat. No. 5,673,291.

[51] Int. Cl.$^6$ .............................. H04B 1/10; H04L 1/00; H03M 13/22
[52] U.S. Cl. ........................... 375/341; 375/346; 371/2.1; 371/43.6
[58] Field of Search ..................................... 375/341, 346; 371/43.6, 43.7, 43.8, 2.1

[56] References Cited

U.S. PATENT DOCUMENTS

| | | | |
|---|---|---|---|
| 4,833,693 | 5/1989 | Eyuboglu | 375/254 |
| 5,091,918 | 2/1992 | Wales | 375/229 |
| 5,230,003 | 7/1993 | Dent et al. | 371/43.6 |
| 5,335,250 | 8/1994 | Dent et al. | 375/224 |
| 5,377,183 | 12/1994 | Dent | 370/335 |
| 5,406,585 | 4/1995 | Rohani et al. | 375/341 |
| 5,537,443 | 7/1996 | Yoshino et al. | 375/340 |
| 5,559,561 | 9/1996 | Wei | 348/470 |
| 5,583,886 | 12/1996 | Rohani et al. | 375/227 |
| 5,619,503 | 4/1997 | Dent | 370/330 |
| 5,640,432 | 6/1997 | Wales | 375/346 |
| 5,673,291 | 9/1997 | Dent | 375/262 |

FOREIGN PATENT DOCUMENTS

WO 96 26578   8/1996   WIPO .

OTHER PUBLICATIONS

K. Giridhar, et al., "Joint Estimation Algorithms for Cochannel Signal Demodulation", Proceedings Of The International Conference On Communications 1993, May 23–26, 1993, New York, U.S., pp. 1497–1501.

(List continued on next page.)

*Primary Examiner*—Stepehen Chin
*Assistant Examiner*—Jeffrey W. Gluck

[57] ABSTRACT

A digital information bit that has been encoded and transmitted as a first modulated signal from a first transmitter in the presence of a second modulated signal that has been transmitted by a second transmitter is received and decoded by receiving a composite signal that is a sum of the first modulated signal and the second modulated signal. The composite signal is processed to generate a complex numerical sample. Then, a plurality of bit pairs are hypothesized, wherein each hypothesized bit pair includes a hypothesized first information bit encoded and transmitted by the first transmitter and a hypothesized second information bit encoded and transmitted by the second transmitter. For each of the plurality of hypothesized bit pairs, a path metric is generated that is indicative of a likelihood that information sequence estimates are accurate estimates, wherein the information sequence estimates include the hypothesized first and second information bits. For each of the plurality of hypothesized bit pairs, the generated path metric is added to a previously determined cumulative path metric to generate a most recent cumulative path metric. An information sequence estimate is selected that has a lowest most recent cumulative path metric, wherein the selected information sequence estimate includes an information sequence estimated to have been encoded and transmitted by the first transmitter and an information sequence estimated to have been encoded and transmitted by the second transmitter.

9 Claims, 5 Drawing Sheets

OTHER PUBLICATIONS

K. Giridhar, et al., "A Blind Adaptive MAP Algorithm for the Recovery of Cochannel Signals", Proceedings Of The Military Communications Conference 1994, Oct. 2–5, 1994, New York, U.S., pp. 133–138.

K. Giridhar, et al., "Joint Demodulation of Cochannel Signals Using MLSE and MAPSD Algorithms", International Conference On Acoustics, Speech, 1993, Apr. 27–30, 1993, New York, U.S., pp. IV–160–IV–163.

Hidekazu Murata, et al., "Maximum–Likelihood Sequence Estimation for Coded Modulation in the Presence of Co–Channel Interference and Intersymbol Interference", IEEE Vehicular Technology Conference 1996, Apr. 28, 1996, New York, U.S., pp. 701–705.

Richard Gooch, et al., "Demodulation of Cochannel QAM Signals", International Conference On Acoustics, Speech and Signals Processing 1989, May 23–26, 1989, New York, U.S., pp. 1392–1395.

```
STATE                                                                  ┌─70
MEMORY

ALREADY PROCESSED   CURRENT      REFERENCE   PATH
SYMBOL HYPOTHESES   HYPOTHESES   VECTOR      METRICS
                                 ARRAYS
!-!-!-!-!-!-!-!-!   !-!-!-!-!    !---!       !---!              (62)     MISMATCH FOR
!1!0!0!1!0!0!1!1!   !0!0!0!0!    !Z0 !       !9.5!------->! + !<---!     STATE 0000+0000
!-!-!-!-!-!-!-!-!   !-!-!-!-!    !---!       !---!         !-!-!
!1!1!0!1!1!0!0!1!   !0!0!0!1!    !Z1 !       !8.1!         NEW ! CANDIDATE
!-!-!-!-!-!-!-!-!   !-!-!-!-!    !---!       !---!         PATH ! METRIC
!1!0!1!0!1!0!1!0!   !0!0!1!0!    !Z2 !       !9.6!
!-!-!-!-!-!-!-!-!   !-!-!-!-!    !---!       !---!
!1!0!0!1!0!0!1!1!   !0!0!1!1!    !Z3 !       !2.3!
!-!-!-!-!-!-!-!-!   !-!-!-!-!    !---!       !---!           !COMPARATOR
!1!1!1!1!1!0!0!1!   !0!1!0!0!    !Z4 !       !7.4!         !-!-! (63)
!-!-!-!-!-!-!-!-!   !-!-!-!-!    !---!       !---!         ! ? !--->
!1!0!0!1!0!0!1!1!   !0!1!0!1!    !Z5 !       !8.7!         !-!-! LOWER OF 2
!-!-!-!-!-!-!-!-!   !-!-!-!-!    !---!       !---!               SURVIVES
!1!0!1!1!0!0!1!0!   !0!1!1!0!    !Z6 !       !9.9!               TO FURTHER
!-!-!-!-!-!-!-!-!   !-!-!-!-!    !---!       !---!               COMPARISON
!1!1!0!1!0!0!1!0!   !0!1!1!1!    !Z7 !       !1.5!
!-!-!-!-!-!-!-!-!   !-!-!-!-!    !---!       !---!         !-!-! MISMATCH
!1!1!0!1!1!0!1!1!   !1!0!0!0!    !Z8 !       !1.8!------->! + !<--- FOR
!-!-!-!-!-!-!-!-!   !-!-!-!-!    !---!       !---!         !---! STATE 1000+0000
!1!0!0!0!0!0!0!1!   !1!0!0!1!    !Z9 !       !6.5!          (64)
!-!-!-!-!-!-!-!-!   !-!-!-!-!    !---!       !---!
!1!0!0!1!0!0!1!1!   !1!0!1!0!    !Z10!       !5.6!
!-!-!-!-!-!-!-!-!   !-!-!-!-!    !---!       !---!
!1!1!1!0!0!0!1!1!   !1!0!1!1!    !Z11!       !3.3!
!-!-!-!-!-!-!-!-!   !-!-!-!-!    !---!       !---!
!1!0!0!1!0!1!1!1!   !1!1!0!0!    !Z12!       !9.5!
!-!-!-!-!-!-!-!-!   !-!-!-!-!    !---!       !---!
!1!1!1!0!0!0!1!1!   !1!1!0!1!    !Z13!       !7.0!
!-!-!-!-!-!-!-!-!   !-!-!-!-!    !---!       !---!
!1!0!1!1!0!1!1!0!   !1!1!1!0!    !Z14!       !4.2!              JOINT
!-!-!-!-!-!-!-!-!   !-!-!-!-!    !---!       !---!             MISMATCH
!1!0!0!1!0!0!1!1!   !1!1!1!1!    !Z15!       !1.1!
!-!-!-!-!-!-!-!-!   !-!-!-!-!    !-!-!       !---!       EXPECTED!----!-----!
                !                                         SUM OF !
                !   SELECT!VECTOR      !---------!VALUES !COMPARATOR!
                !   --------------->! JOINT      !------->!  (61)   !
                !------------------>! TXMTR      !----!-----!
         SELECT HYPOTHESES eg 1111 ! MODEL
                          +1010 !
                          --->! (600)                    RECEIVED SAMPLE
                              !  !---------!             FOR PROCESSING
           New bit hypotheses (0+0,0+1,
                          1+0 or 1+1)
```

FIG. 4

INTERFERENCE MITIGATION BY JOINT DECODING OF OVERLAPPED SIGNALS

CROSS REFERENCE TO RELATED APPLICATIONS

This is a continuation-in-part of application Ser. No. 08/179,953, Jan. 11, 1994, now U.S. Pat. No. 5,619,503, and of application Ser. No. 08/305,787, filed Sep. 14, 1994, now U.S. Pat. No. 5,673,291.

BACKGROUND

The present invention relates to radio communications systems for transmitting and receiving coded digital information, and more particularly to digital cellular radio telephone systems and interference cancellation between radios using the same channel frequency.

One problem that occurs in mobile communications systems, such as in cellular telephone systems, is co-channel interference that is created when two or more transmitters (such as mobile units) simultaneously modulate different symbols onto the same carrier frequency. This situation is illustrated in FIG. 1, which is a block diagram of a communications system in which at least two transmitters 1, 2 transmit data on the same frequency. Each of the transmitters 1, 2 may intend for its data to be received by a different one of, say, two receiver sites 3, 4. However, the data from each of the transmitters 1, 2 may all be received at the same receiver site (e.g., a first receiver 3) with consequent co-channel interference between the signals.

The transmitters 1 and 2 are conventional transmitters, such as those utilized in digital cellular radio telephones conforming to standards such as GSM, IS136 or IS54. FIG. 2 is a block diagram of an exemplary one of these transmitters. The exemplary transmitter comprises an information source 10 that provides an information bit stream to an error correction encoder 11. The information source 10 may, for example, be a speech digitizing and compression device. The error correction encoder 11 is preferably a convolutional encoder comprising a register 111 through which the information bits are clocked, and a parity bit computer 112 connected to taps on the register 111. The parity bit computer 112 forms coded bits or parity bits which are a function of selected register bits. The number of parity bits formed on each shift is equal to the reciprocal of the coding rate, r. The parity bits supplied by the encoder 11 are fed to an interleaver 12. The interleaver 12 re-orders the output parity bit sequence from the encoder 11 to produce the sequence for transmission. While the encoder 11 is not necessarily the same for each of the transmitters 1 and 2, each interleaver 12 in the system may perform identical interleaving such that corresponding bits from different transmitters 1, 2 are transmitted at the same time. The interleaver incorporates the function of interspersing a known symbol pattern into the transmitted stream for the purposes of receiver synchronization and for providing a vector reference to the receiver 3, 4 for processing unknown symbols.

Before or after interleaving, or both, scrambling or encryption of the coded or uncoded information symbols takes place by utilizing either or both of first and second combiners 17 and 18 to combine bits with keystream bits generated by a key generator 16. The key generator 16 generates the key stream in dependence on key bits that are at least known to the receiver for every transmitted signal that the receiver is intended to demodulate. The key stream may otherwise be kept secret from potential eavesdroppers.

The enciphered bit sequence for transmission is modulated using a radio frequency modulator 13 to produce a drive signal for a transmitter 14. The transmitter 14 may then further condition the signal by, for example, upconverting it to a desired radio frequency channel and amplifying it to a transmit power level. The further conditioned signal is then supplied to an antenna 15 for transmission.

In order to mitigate this type of co-channel interference, it is known to perform joint demodulation of these overlapped signals by simultaneously hypothesizing symbols transmitted by at least a first and a second transmitter. An example of such a scheme, applied in connection with antenna arrays, is disclosed in U.S. Pat. No. 5,619,503 (Dent, filed Nov. 1, 1994), which is hereby incorporated by reference herein in its entirety.

Joint demodulation of multiple signals transmitted on different frequencies in order to mitigate adjacent channel interference is furthermore disclosed in U.S. patent application Ser. No. 08/393,809 (Dent, filed Feb. 24, 1995), which is hereby incorporated by reference herein in its entirety. This referenced application shows that a Maximum Likelihood Sequence Estimator (MLSE) is capable of operating sequentially to decode one bit transmitted at the same instant in time from each of a number of transmitters using sequential frequencies, as opposed to prior known MLSE which decoded bits transmitted at the same frequency sequentially in time.

U.S. Pat. No. 5,230,003 (Dent and Raith, issued on Jul. 20, 1993), which is hereby incorporated by reference herein in its entirety, also describes distinguishing between two differently coded signals. However, this patent is concerned with distinguishing between signals that may be alternatively transmitted; it is not concerned with distinguishing between signals that are simultaneously transmitted.

U.S. Pat. No. 5,673,291 (Dent, filed Sep. 14, 1994), which is hereby incorporated by reference herein in its entirety, discloses the simultaneous demodulation and error-correction decoding of a signal using a single MLSE process. Joint demodulation and decoding, referred to as "decodulation", can improve performance over that of separately demodulating then decoding a signal, because the output of the demodulation process in the latter case is not constrained to be a valid codeword, and thus errors occur at the demodulation stage. In the decodulation process, however, only signals corresponding to valid codewords are demodulated, thereby avoiding errors at the demodulation stage. FIG. 3 illustrates the internal arrangement of an implementation of a decodulator for simultaneously demodulating and error-correction decoding a single signal according to the above-incorporated U.S. Pat. No. 5,673, 291. Of particular importance is the column of complex arrays marked Z0 to Z15 and entitled "reference vector arrays." Each quantity Z is preferably a multiplicity of complex values, that is, a complex vector array, with each value in each array Z representing the best current estimate of the radio signal vector just prior to a signal sample to be processed, under the assumption that the associated "current hypothesis" is true. The number of values in each array Z is preferably equal to twice the number of known symbol blocks included in the signal bursts being processed, in the case of differential modulation, or equal to the number of known symbol blocks in the case of absolute phase modulation. The number of values is preferably equal to twice the number of known symbol blocks also for absolute (coherent) modulation, when the propagation path suffers from fast fading. For example, if interleaving spreads differentially coded symbols over two signal segments or bursts, such as time division multiple access (TDMA) bursts or data packets, interspersed with six known, isolated sync symbols per burst, then the number of values in each array Z such as Z0 is 24. In this example, there are six known symbol blocks, but each consists only of a single, isolated symbol. The number of known symbols in a block may, however, be greater than one. The values represent estimates of the signal vector $Z_L$ at a position to the left and $Z_R$ to the right of a known sync symbol respectively. The Z values are initialized to estimates of the nominal complex reference value for the signal on each side of the respective sync symbol. For example, if the first sync symbol in the first signal burst is known to be differential rotation through +90 degrees, and the received signal vectors before and after this known rotation are respectively Z(i−1) and Z(i), then the best estimate of the phase to the left of (i.e., before) the sync symbol is given by $Z_L=(Z(i-1)-jZ(i))/2$, and the best estimate of the signal vector to the right of (i.e., after) the sync symbol is $Z_R=(jZ(i-1)+Z(i))/2$.

The former is obtained by rotating Z(i) backwards through the known 90 degree phase shift to align it with the previous value Z(i−1), and then averaging the two. The latter is obtained by rotating Z(i−1) forward through the known 90 degree phase shift to align it with Z(i) and then averaging the two. A variable scaling of the sum other than by division always by two is sometimes beneficial as disclosed in the incorporated application.

Decodulation proceeds as follows. A hypothesis for a transmitted symbol sequence filling all positions in the convolutional encoding shift register 111 is made. For example, if a constraint-length 5 code is employed, the encoding shift register has five stages. Selecting the row in FIG. 3 corresponding to the hypothesis 0000 and hypothesizing a new 0 bit is equivalent to hypothesizing that the transmitting encoder register 111 contained five zeros at that point. These hypothesized shift register contents are then used to generate the encoded bits P1, P2, . . . that should have been transmitted if the hypothesis is correct. This is carried out by incorporating into the receiver a transmitter model 60 that includes a model of the convolutional encoder 11. The transmitter model 60 also incorporates the known modulation parameters so that complex signal values representative of P1 and P2 can be predicted, as well as the interleaving or bit placement information to predict where in the received signal segments the encoded bits P1, P2, . . . would be expected to be observed.

The first bits P1, P2 hypothesized with the aid of the transmitter model 60 are preferably located adjacent to known sync symbols as disclosed in the referenced patent application. Assuming binary modulation such as Minimum Shift Keying (MSK), in which a binary '1' is represented by a +90 degree phase rotation from one sample to the next and a binary '0' is represented by a −90 degree rotation, then if P1 is hypothesized to be a '1' we should receive a signal sample rotated by +90 degrees relative to the reference vector (a $Z_R$ or $Z_L$ value) that the signal sample lies adjacent to. Thus the relevant reference value is extracted from the array Z0 (a $Z_R$ or $Z_L$ value dependent on whether the signal sample being processed lies to the left or the right of a known symbol block) and rotated by 90 degrees before comparison in comparator 61 with the received sample. This corresponds to the hypothesis that $P_1$ is a zero. The error is squared to produce the signal mismatch value for $P_1$ which is added to the cumulative path metric for the state 0000 in adder 62. This is repeated for $P_2$ or any other coded bits, the number of which is the reciprocal of the coding rate r, with each received signal sample corresponding to a coded bit being selected from a position in the received sample stream according to the known interleaving pattern. According to whether this position is to the left or to the right of any known sync symbol block, it is compared with the relevant $Z_L$ or $Z_R$ value from the array Z0.

The new path metric is, at this point, only regarded as a candidate value for a new state/hypothesis 0000, as the hypothesis 1000 followed by a new bit 0 is an equally possible candidate. When the convolutional encoder shifts its encoding register one place to the left, the leftmost 1 or 0 will move out of the register leaving, in both cases, 0000 in the four leftmost positions. Thus, a candidate metric is calculated in precisely the same way as above, but starting with the hypothesis 1000-0 and using its corresponding reference vector Z-values. The second candidate metric from a second adder 64 is then compared with the first from the first adder 62 in a second comparator 63 and the lower of the two is selected. If this is from the second adder 64, then the hypothesis 1000-0 is deemed to be a better hypothesis than 0000-0, and state/hypothesis 1000 is called the "best predecessor" to new state 0000. The contents of the "already processed" memory associated with the best predecessor are then selected to be the contents of the already processed symbol memory of new state 0000, and a '1' or a '0' is left-shifted in from the right hand side of this memory according to whether the best predecessor was 1000 or 0000. To the left of FIG. 3, there is an area of memory labeled "ALREADY PROCESSED SYMBOL HYPOTHESES." This is sometimes also known more succinctly as the "PATH HISTORY." If 1000 is deemed the "best predecessor state," then its path history is used as the path history for new state 0000, else the path history of old state 0000 is used. If the former, its path history, 11011011, is left shifted with the state number 1000 and the new bit=0 so that 11011011-1000-0 becomes 110110111-0000, where the "110110111" part is the new path history, and the "0000" part is the new state number. If 1000 is not deemed the "best predecessor state," so that the path history of old state 0000 is used, then 10010011-0000-0 becomes 100100110-0000, where the "100100110" part is the new path history, and the "0000" part is the new state number. The lower of the candidate metrics also becomes the new path metric, and the reference vector array associated with the best predecessor is selected to be the reference vector array for the new state, after updating it preferably using a Kalman channel tracking algorithm per state.

Repeating the above process for a new bit hypothesis of '1' instead of '0' generates a new state 0001 in the same manner. Starting with, in turn, pairs of hypotheses 0001-1001, 0010-1010, and so on, and repeating the above for each pair then generates the rest of the new states so that there are, at the end of one iteration, the same number of new states (sixteen in this example) as at the beginning.

The above procedure is used to process sequentially the received samples in a preferred order in which unknown symbols lying next to known or already decoded symbols are processed first.

The previously referenced U.S. Pat. No. 5,673,291 discloses the use of decodulation for the purpose of discriminating a wanted signal from noise and interference. This reference is silent, however, with respect to techniques for separating two or more wanted signals from each other as well as from noise and interference.

U.S. Pat. No. 5,764,646, entitled "Packet Data Transmission With Clash Subtraction" (Dent, filed Apr. 2, 1996, and bearing Attorney Docket No. 027545-142), which is hereby incorporated by reference herein in its entirety, describes a packet data receiver for receiving bursts of coded data. The invention disclosed therein has means for detecting when a data burst or packet is at least partially overlapped by an interfering packet. The interfering packet, if stronger, is first decoded and subtracted from the received signal before resuming decoding of the received packet. In this case, joint decoding is not used because the overlapping packets are assumed to be very asynchronous, that is, not time-aligned.

SUMMARY

It is therefore an object of the invention to provide a technique mitigating interference that occurs when two or more signals are transmitted simultaneously on the same frequency, and are received as a combined signal.

In accordance with one aspect of the present invention, the foregoing and other objects are achieved in a method and apparatus wherein a digital information bit that has been encoded and transmitted as a first modulated signal from a first transmitter in the presence of a second modulated signal that has been transmitted by a second transmitter is received and decoded by first receiving a composite signal that is a sum of the first modulated signal and the second modulated signal. The composite signal is then processed to generate complex numerical samples. Next, a plurality of bit-pair sequences are successively hypothesized, wherein each hypothesized bit-pair comprises a hypothesized first information bit encoded and transmitted by the first transmitter and a second information bit encoded and transmitted by the second transmitter. Each of the hypothesized bit-pairs is then encoded to generate a corresponding sequence of encoded bit pairs. The complex numerical samples and the encoded bit-pair sequences are processed to generate, for each of the bit pair sequences, a path metric that is indicative of a likelihood that the corresponding hypothesized sequence of information bit-pairs is a correct hypothesis. The generated path metrics are then compared to one another, and the hypothesized information bit pair sequence having a path metric indicative of highest likelihood is selected.

In another aspect of the invention, the encoding step includes supplying the hypothesized first information bit to a model of a first encoder to generate at least one encoded hypothesized first information bit; and supplying the hypothesized second information bit to a model of a second encoder to generate at least one encoded hypothesized second information bit.

In another aspect of the invention, the method and apparatus further include supplying the at least one encoded hypothesized first information bit to a model of the first transmitter and generating therefrom a first hypothesized modulated signal. Similarly, the at least one encoded hypothesized second information bit is supplied to a model of the second transmitter and a second hypothesized modulated signal is generated therefrom. Transmitter models can include models of an error correction encoding process, an interleaving or bit placement process, and a modulation and even propagation process. Models of respective ciphering processes may also be included. Estimates of propagation path phase shift and attenuation experienced by each of the first and second modulated signals in propagating to the receiver are generated. The hypothesized first modulated signal and the hypothesized second modulated signal are then processed by phase shifting and attenuating each by amounts specified by the estimates of propagation path phase shift and attenuation. The processed hypothesized first and second modulated signals are combined to produce an expected composite signal. A composite signal prediction of complex values is generated from the expected composite signal. A delta metric is then generated by comparing the composite signal prediction with the complex numerical sample, wherein the delta metric is indicative of the likelihood that the composite signal prediction is a correct prediction. Next, a joint maximum likelihood sequence estimator is used to accumulate the delta metrics to determine, for each hypothesized bit-pair sequence, the path metric indicative of the likelihood that the associated bit-pair sequence is the correct hypothesis.

BRIEF DESCRIPTION OF THE DRAWINGS

The objects and advantages of the invention will be understood by reading the following detailed description in conjunction with the drawings in which:

FIG. 4 illustrates an exemplary embodiment of a 256-state MLSE machine for jointly decodulating two overlapping signals in accordance with the invention.

DETAILED DESCRIPTION

Figure 1:
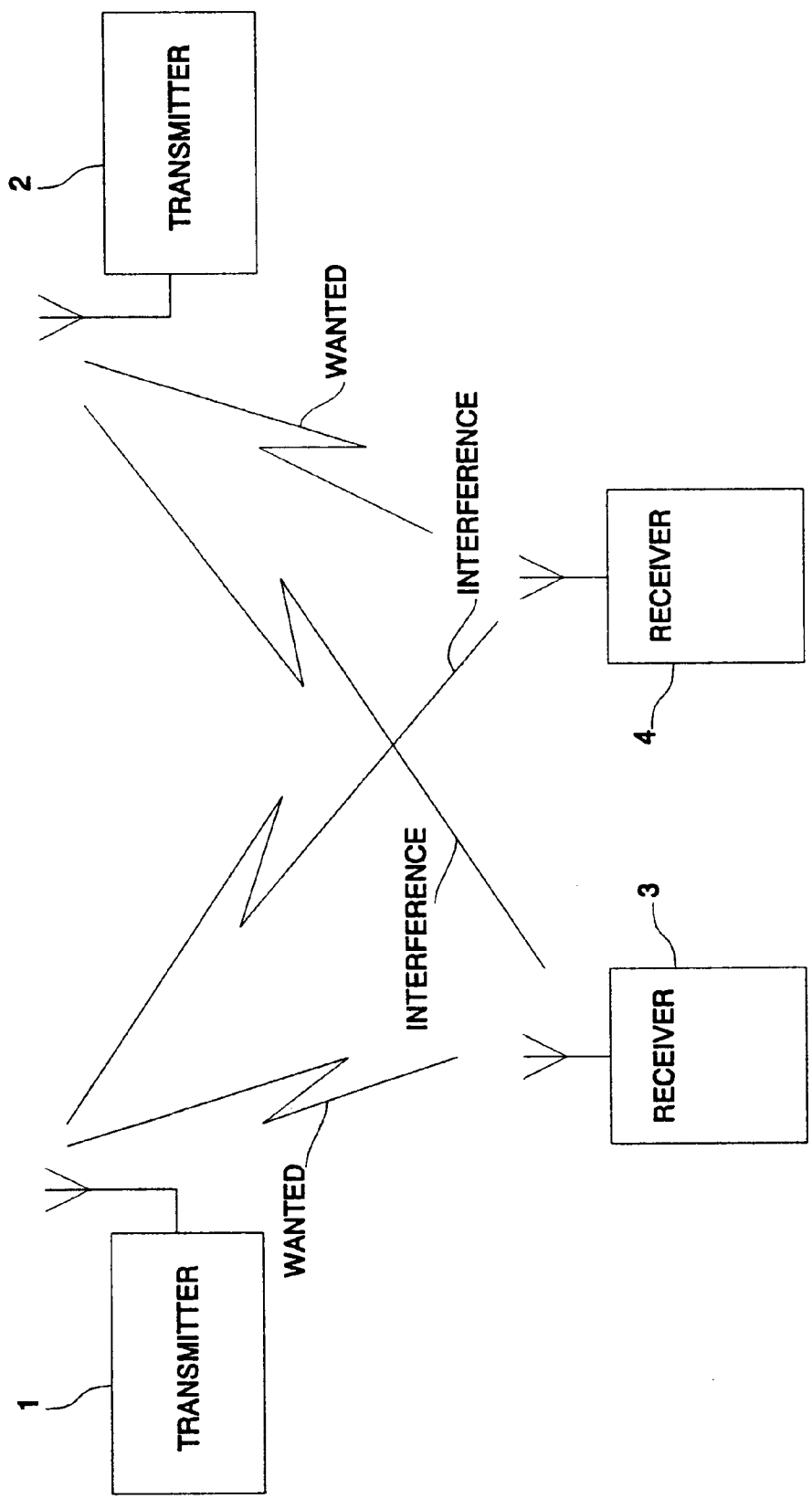
FIG. 1 is a block diagram of a communications system in which at least two transmitters 1, 2 transmit data on the same frequency, thereby warranting application of the invention.

The various features of the invention will now be described with respect to the figures, in which like parts are identified with the same reference characters.

According to one aspect of this invention, a receiver, such as the receiver 3 (see FIG. 1), utilizes known properties of the error correction coding and scrambling processes to separate the at least two signals by demodulating both simultaneously.

Figure 3:
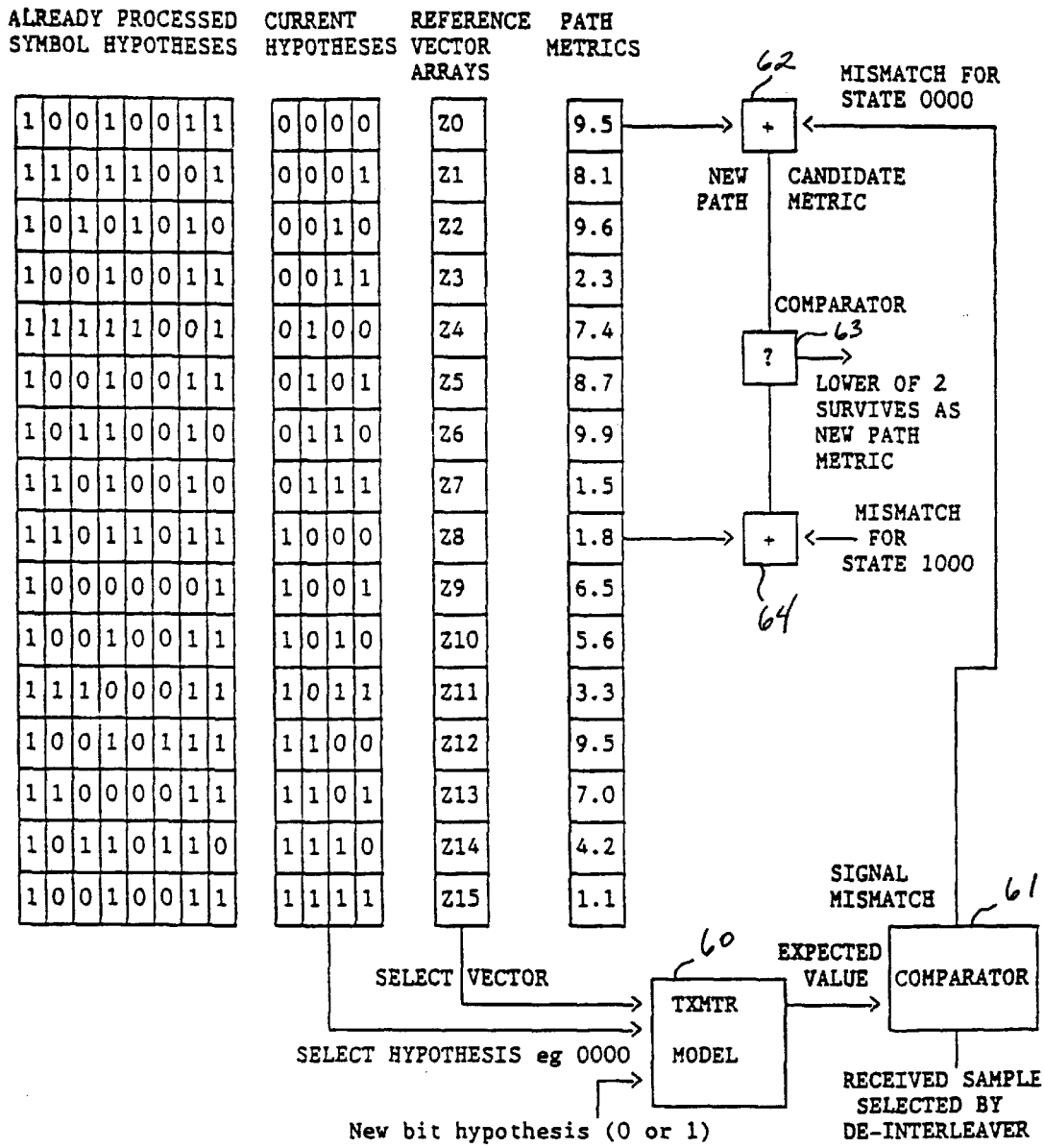
FIG. 3 illustrates the internal arrangement of a prior art implementation of a decodulator for simultaneously demodulating and error-correction decoding a single signal.

More particularly, the current invention uses a process similar to that of FIG. 3 above, but modified in order to process two or more overlapping signals simultaneously. The number of machine states of the MLSE decodulator is increased to be the product of the number of states which each signal encoder alone can take on. For example, if two signals encoded with constraint-length 5 convolutional codes are decoded, then each encoder can be in one of 2 to the power 4 (=16) states prior to encoding each new bit. Four previous bits of each signal plus one new bit of each signal make up the five bits that each encoder register will use to compute coded bits. The number of coded bits computed for each new data bit is the reciprocal of the code rate. For example three coded bits are computed for a rate ⅓rd code, or two for a rate ½ code.

In the above example, the number of joint states is thus 256. FIG. 4 illustrates the 256-state MLSE machine for jointly decodulating two overlapping signals. The 256 states are envisioned to be organized in a 16×16 fashion, and for clarity, only one plane of 16 states is shown, corresponding to each of the possible states of one of the signal encoders, the other plane (going into the page, not shown) containing 16 similar planes each corresponding to one of the 16 possible states of the other signal's encoder.

Figure 2:
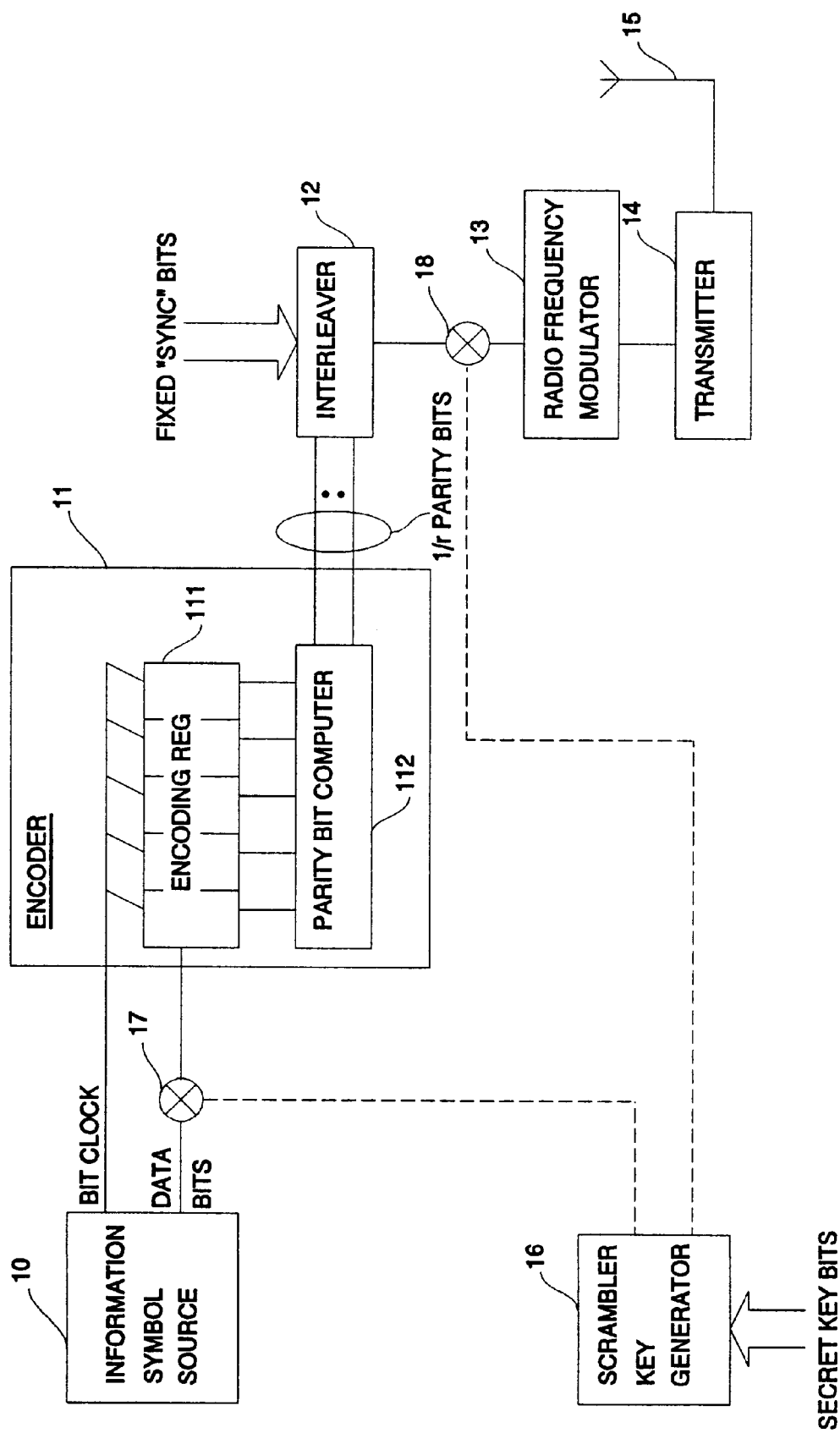
FIG. 2 is a block diagram of a prior art transmitter.

As illustrated in FIG. 4, a signal sample to be processed is received from a receiver (not shown) comprising any suitable antenna, amplification, filtering, downconversion and digitization necessary to obtain numerical values corresponding to the instantaneous sum of all received signals falling within the receiver passband. The values may be stored in a buffer memory (not shown) for recall in any order. A deinterleaver (not shown) performs the reverse process to that performed by the transmitter's interleaver 12 (see FIG. 2) to select the sample for processing. The difference is that the selected sample for processing is, in general, a complex number representing the phase and amplitude of the total received signal.

The first comparator 61 of FIG. 4 functions the same as the first comparator 61 of FIG. 3 to compute the mismatch between the received sample and a prediction that was made by a model of the transmitter applied to an estimate of the phase shift and attenuation introduced by the propagation path. In this case however, the transmitter model 60 of FIG. 3 has been replaced by a joint transmitter model 600 that predicts the received sample based on:

1) Four bits selected from the state number of a first signal corresponding to one of the rows of data in the state memory 70 of FIG. 4 (the bits 1111 are illustrated in the figure, but all sixteen possibilities are selected at some stage in the process);

2) Four bits selected from the state number of a second signal corresponding to one of 16 rows in the third dimension (not shown) (the bits 1010 are illustrated in the figure, but all sixteen possibilities are selected at some stage in the process);

3) A new hypothesis of 0 or 1 for the next information bit of the first signal;

4) A new hypothesis of 0 or 1 for the next information bit of the second signal; and 5) A vector reference (Z-value) comprising, for the selected one of 16×16 joint states, phase and amplitude information for the propagation paths including delayed signal echoes from each of the transmitters to the receiver.

The latter propagation path estimates are made initially by correlating with known sync symbols inserted by the transmitters' interleavers 12. Joint correlation may preferably be employed, in which the received signal pattern is hypothesized to be the weighted sum of shifted versions of the sync patterns transmitted by each of the transmitters 1 and 2, and the complex weights are determined by least-squares methods to best fit the received signal. It can assist the determination of the two propagation paths if the sync patterns of the two transmitters are chosen to be orthogonal.

The joint transmitter model 600 also comprises a mechanism for scrambling the data using key generators programmed with the known keys of each transmitter 1, 2.

In accordance with the invention, the mismatch computed for a certain pair of states of the first and second signals, such as 1111+1010, is added to a previous cumulative path metric for the pair of state numbers, (e.g., to path metric M(15,10) using the examples 1111 (=15) and 1010 (=10)), to obtain a new path metric for the newly hypothesized bits. All bits (1/r in number) produced by the transmitter error correction encoder are used in producing the path metric). If the new bits are 0+0 for example, the new path metric will be associated with new states 1110 and 0100, which are obtained by shifting the new 0's in to the right-hand end of previous state numbers 1111 and 1010, the leftmost digits (1 and 1) falling out of significance to the left. Another candidate path metric for the same new state pair is computed using old state numbers 0111 and 0010, and the smaller of the two selected by a second comparator 63. Then, the procedure is repeated for old state numbers 0111+1010 and 1111+0010 to obtain a further surviving candidate from the second comparator 63. Finally, a third comparison (not shown) compares the two remaining candidates to obtain the best of four candidate new path metrics for new state 1110+0100, and the best of the four predecessor states (1111+1010; 1111+0010; 0111+1010; and 0111+0010) is determined. The path history from the best predecessor state is then selected to become the path history of the new state 1110+0100 and the leftmost bits that fell out of the state numbers to the left are shifted into the path history to record which of the four candidate state-pairs survived in that case.

The above process is repeated for all four hypotheses of a new bit for the first signal and a new bit for the second signal to form new states: 1110+0100; 1110+0101; 1111+0100; and 1111+0101.

The whole of the above is then repeated starting with different groups of four state-pairs until 16×16 new states is obtained, each with a new path history and a new path metric which is the best of four.

The Z-values representing vector references may then be updated if the propagation path is changing rapidly due to fading and relative receiver-transmitter motion. Each set of Z-values associated with a state-pair is updated on the assumption that the path history associated with the state, representing estimates of data bits from both transmitters, is true, that is, that no bit errors have occurred. Of course, only one state-pair contains the true data, but at this time it is not known which; preferably therefore, each state pair contains its own vector reference estimates. The vector references of the best predecessor state are also used to become the vector references of each new state-pair derived from the predecessor state pair. Vector references associated with states containing erroneous bit estimates will thus not survive the selection process because erroneous bit patterns tend to produce higher cumulative path metrics which do not get selected in the first or second comparators 61 or 63.

The joint decodulator of FIG. 4 thus maintains 16×16 hypotheses for four current bits of a first transmitter and four current bits of a second transmitter. Bits older than the four current bits do not, in the case of the exemplary constraint-length 5 error correction code, affect the estimate of a received composite signal sample and thus lie in the "ALREADY PROCESSED" or "PATH HISTORY" section of the memory. For each of the 16×16 states, there is an associated path history, which is the best answer for the decoded bits of both transmitters, on the assumption that its associated pair of 4-bit current states is true. While it may never be known which is true in the case of continuous processing of a continuously received signal, the eldest bits in all path histories tend more and more to agree, and when they all agree, there is no doubt what the eldest decoded bit polarity is. It may then be output from the device and all path histories shortened by one bit. Sometimes it is desirable to truncate the length of the path history memory irrespective of whether all estimates of the eldest bit have converged, in order to guarantee that overflow of the memory will not occur. When a decision has to be made to limit path memory growth, it is known as "finite decision depth." Of all postulated schemes for taking decisions using a finite decision depth, that which seems to work best is to output the eldest bit from the state having the lowest cumulative path metric after each complete iteration. Thus, the path history is maintained at a constant length or "decision depth" in order to guarantee fitting within a given memory. Typically, decision depths of three to five constraint lengths are needed to avoid significant performance degradation.

One function accomplished by the decodulator of FIG. 3 and also by the joint decodulator of FIG. 4 is the handling of signal distortion caused by delayed echoes. In this case, the joint transmitter model 600 can incorporate a model of the propagation paths for each transmitter including delayed echoes. The vector references (Z-values) then include estimates of the phase and amplitude of each echo of each signal including the direct wave, these commonly being known as channel estimates or channel models.

U.S. Pat. No. 5,377,183 is by the same inventor and commonly assigned and is hereby incorporated by reference herein in its entirety. This referenced patent application describes a new variation of the adaptive Viterbi equalizer that does not employ channel models to generate the signal predictions, except perhaps for initiaparamet-up, and no updating of channel model parameters is thus employed. Instead, direct updating of the signal predictions for each state is used, without going through the intermediate step of first updating a channel model.

The invention described above and illustrated in FIG. 4 may employ any or all of the variations in coding and modulation described in the incorporated references, such as punctured convolutional encoding for providing unequal error protection to different bits, termination of a coding block by using tail bits or tail-biting or using continuous convolutional encoding and decoding, and any binary or multi-level modulation method that maps coded symbols to a corresponding radio signal phase and amplitude known as a constellation point.

Figure 5:
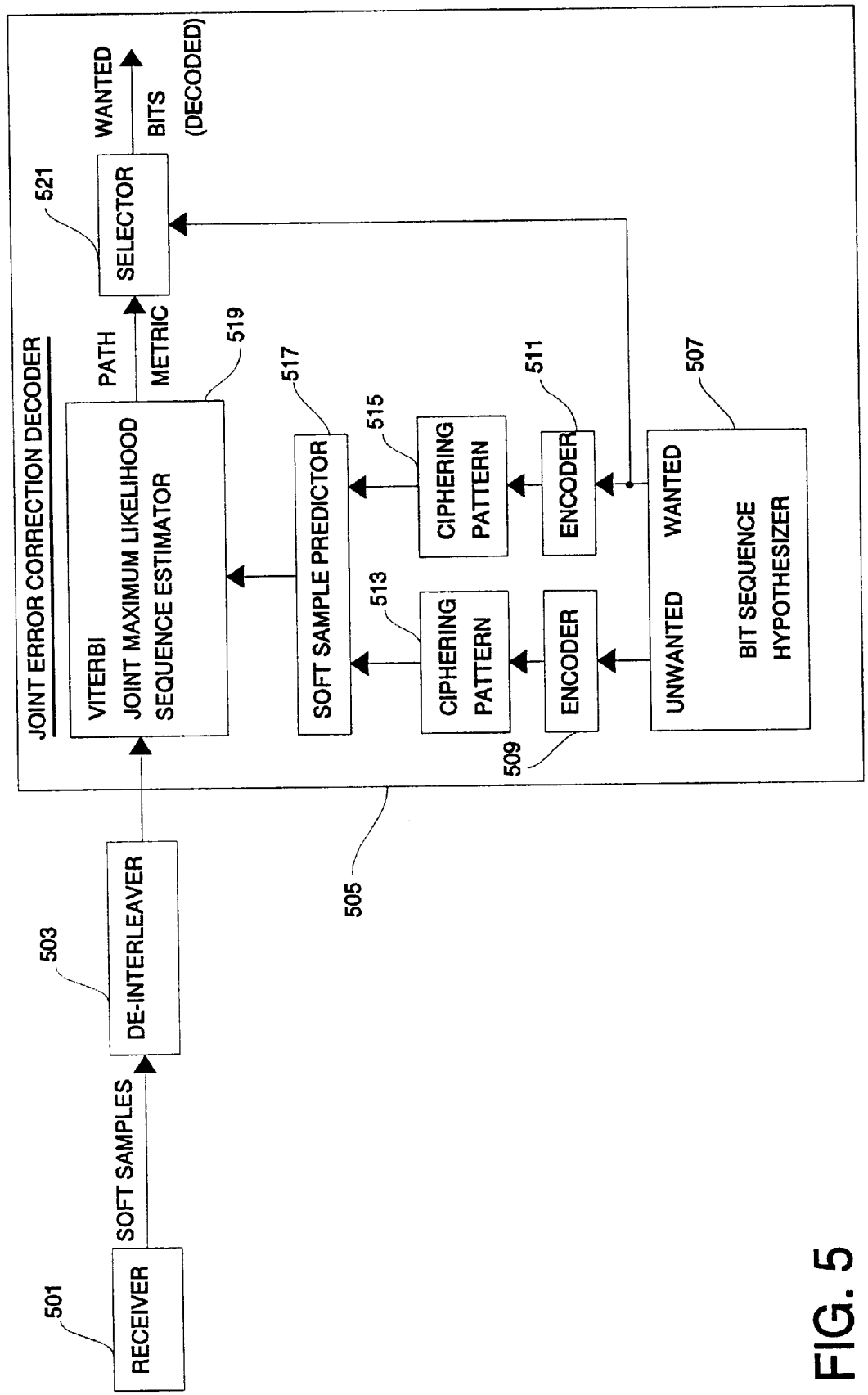
FIG. 5 is a block diagram of an apparatus for mitigating interference in accordance with one aspect of the invention.

FIG. 5 is a block diagram of an apparatus for mitigating interference in accordance with one aspect of the invention. A receiver 501 generates "soft samples" which are supplied to a de-interleaver 503. The de-interleaved samples are then fed to a joint error-correction decoder 505. The joint error-correction decoder 505 includes a bit sequence hypothesizer 507, which hypothesizes transmitted bit sequences simultaneously for two or more co-channel signals. The hypothesized transmitted bit sequences are supplied to respective encoders 509, 511. The encoded signals are then supplied to means for applying corresponding, unique ciphering patterns 513, 515. A soft sample predictor 517 receives the outputs from the ciphering pattern means 513, 515. The soft sample predictor 517 predicts the soft sample value sequences that the receiver should correspondingly output. A cumulative mismatch between predicted and actual received values, the path metric, is computed by a Viterbi Joint Maximum Likelihood Sequence Estimator 519. A selector 521 receives the path metric and the hypothesized wanted bit sequences, and those hypothesized data sequences resulting in the lowest path metric are retained. The data bits for the wanted signal are then output and the data bits for the unwanted signals are discarded.

Commonly assigned U.S. Pat. No. 5,335,250, which is hereby incorporated by reference herein in its entirety, describes a method of minimizing loss of intervening data when a temporary signal fade causes loss of one of the training patterns. The principle taught there is to demodulate intervening data not only forwards from a training pattern but also backwards from the next training pattern by first storing received signal samples in a memory and then time-reversing the sequence, and to make quality estimates of demodulation in each direction to determine how many data symbols shall be decoded by forward demodulation and how many by backward demodulation. When the coding used is of the tail-biting form in which information symbols are arranged in a circle to produce a corresponding cycle of coded bits, a related variation to forward and backward demodulation is clockwise versus counterclockwise demodulation and tailbiting permits any starting point to be used at which an initial set of channel estimates is available. It can be beneficial to select as a starting point a position within a signal segment where the signal is known to be of relatively high quality.

Other variations described in the incorporated references that may be used also in the current joint decoder include fractionally spaced decodulation, in which a plurality of signal samples spaced over each received symbol period are processed.

Moreover, the invention is not limited exclusively to signals encoded with convolutional encoding, but may also be applied to block coded signals, albeit with (typically) an increase in the number of MLSE machine states.

Ciphering is also not a necessity for practicing the invention, but some means for distinguishing the different coded signals should be used, such as employing different coding polynomials (i.e., the parity bit computer 112 generates different functions for different transmitters). There are many equivalent coding polynomials that can be chosen which have equal coding performance but generate distinct outputs. Ideally, the output sequence of one encoder should lie in the "null space" of another encoder, the concept of "null-space" being familiar to persons skilled in coding theory.

The current invention differs from the strategy described in U.S. patent application Ser. No. 08/393,809 (referenced above) in that the joint processing performed comprises joint error-correction decoding rather than joint demodulation. The inventive method improves performance by utilizing the coding gain of an error correction code to further distinguish between overlapping signals that are differently coded.

The invention has been described with reference to a particular embodiment. However, it will be readily apparent to those skilled in the art that it is possible to embody the invention in specific forms other than those of the preferred embodiment described above. This may be done without departing from the spirit of the invention. The preferred embodiment is merely illustrative and should not be considered restrictive in any way. The scope of the invention is given by the appended claims, rather than the preceding description, and all variations and equivalents which fall within the range of the claims are intended to be embraced therein.

What is claimed is:

1. A joint soft-decision decoder for decoding overlapping received signals, comprising:

receiver means for receiving the overlapping received signals and outputting signal samples representative of a weighted sum of the overlapping received signals and a delayed signal echo of at least one of the overlapping received signals;

a deinterleaver for generating deinterleaved samples from the signal samples, wherein successive sets of deinterleaved samples depend only on successive information bits and one or more previous information bits;

joint sequential maximum likelihood processing means for processing the deinterleaved samples and forming hypotheses of information bit sequences encoded in each of the overlapping received signals and computing cumulative path metrics for each combination of a hypothesis of one information bit sequence with a hypothesis of each of the other information bit sequences, wherein the path metrics are indicative of the likelihood that the associated combination of hypothesized information bit sequences comprises the correct hypotheses; and selection means for selecting the combination of hypothesized information bit sequences having an associated cumulative path metric indicative of highest likelihood, thereby decoding the overlapping received signals, wherein said overlapping received signals are interleaved prior to transmission such that each signal, observed at a given time, is dependent only on a current information bit and one or more previous information bits.

2. A method for receiving in a receiver and decoding a digital information bit that has been encoded, interleaved and transmitted as a first modulated signal from a first transmitter in the presence of a second modulated signal that has been transmitted by a second transmitter, the method comprising the steps of:

receiving a composite signal that is a sum of the first modulated signal, the second modulated signal and a delayed signal echo of at least one of the first and second modulated signals;

processing the composite signal to generate soft samples;

deinterleaving the soft samples to generate deinterleaved complex numerical samples, wherein successive sets of deinterleaved complex numerical samples depend only on successive information bits and one or more previous or previously hypothesized information bits;

successively hypothesizing pairs of information bits to generate a plurality of bit-pair sequences wherein each hypothesized bit-pair comprises a hypothesized first information bit encoded and transmitted by the first transmitter and a second information bit encoded and transmitted by the second transmitter;

forward error correction encoding each of the plurality of bit-pair sequences to generate a corresponding sequence of encoded bit-pairs;

processing the deinterleaved complex numerical samples and the encoded bit-pair sequences to generate for each of the bit-pair sequences a path metric indicative of a likelihood that the corresponding hypothesized sequence of information bit-pairs is a correct hypothesis;

comparing the path metrics to one another and selecting the hypothesized information bit-pair sequence having a path metric indicative of highest likelihood, wherein said interleaving is such that the first modulated signal observed at a given time is dependent only on a current information bit and one or more previous information bits.

3. The method of claim 2, wherein the encoding step comprises:

supplying the hypothesized first information bit to a model of a first encoder to generate at least one encoded hypothesized first information bit; and supplying the hypothesized second information bit to a model of a second encoder to generate at least one encoded hypothesized second information bit.

4. The method of claim 3, further comprising the steps of:

supplying the at least one encoded hypothesized first information bit to a model of the first transmitter and generating therefrom a first hypothesized modulated signal;

supplying the at least one encoded hypothesized second information bit to a model of the second transmitter and generating therefrom a second hypothesized modulated signal;

generating estimates of propagation path phase shift and attenuation experienced by each of the first and second modulated signals in propagating to the receiver;

processing the hypothesized first modulated signal and the hypothesized second modulated signal by phase shifting and attenuating each by amounts specified by the estimates of propagation path phase shift and attenuation;

combining the processed hypothesized first and second modulated signals to produce an expected composite signal; and generating a composite signal prediction of complex values from the expected composite signal, wherein the step of processing the deinterleaved complex numerical samples and the encoded bit-pair sequences to generate for each of the bit-pair sequences the path metric indicative of the likelihood that the corresponding hypothesized sequence of information bit-pairs is the correct hypothesis comprises the steps of:

generating a delta metric by comparing the composite signal prediction with the deinterleaved complex numerical sample, wherein the delta metric is indicative of the likelihood that the composite signal prediction is a correct prediction; and using a joint maximum likelihood sequence estimator to accumulate the delta metrics to determine, for each hypothesized bit-pair sequence, the path metric indicative of the likelihood that the associated bit-pair sequence is the correct hypothesis.

5. The method of claim 2, wherein the step of processing the composite signal to generate the soft samples comprises the steps of amplifying, downconverting, filtering and analog-to-digital converting the composite signal.

6. An apparatus for receiving and decoding a digital information bit that has been encoded, interleaved and transmitted as a first modulated signal from a first transmitter in the presence of a second modulated signal that has been transmitted by a second transmitter, the apparatus comprising:

means for receiving a composite signal that is a sum of the first modulated signal, the second modulated signal and a delayed signal echo of at least one of the first and second modulated signals;

means for processing the composite signal to generate soft samples;

means for deinterleaving the soft samples to generate deinterleaved complex numerical samples, wherein successive sets of deinterleaved complex numerical samples depend only on successive information bits and one or more previous or previously hypothesized information bits;

means for successively hypothesizing pairs of information bits to generate a plurality of bit-pair sequences wherein each hypothesized bit-pair comprises a hypothesized first information bit encoded and transmitted by the first transmitter and a second information bit encoded and transmitted by the second transmitter;

means for forward error correction encoding each of the plurality of bit-pair sequences to generate a corresponding sequence of encoded bit pairs;

means for processing the deinterleaved complex numerical samples and the encoded bit-pair sequences to generate for each of the bit pair sequences a path metric indicative of a likelihood that the corresponding hypothesized sequence of information bit-pairs is a correct hypothesis;

means for comparing the path metrics to one another and selecting the hypothesized information bit pair sequence having a path metric indicative of highest likelihood;

wherein said interleaving is such that the first modulated signal observed at a given time is dependent only on a current information bit and one or more previous information bits.

7. The apparatus of claim 6, wherein the encoding means comprises:

means, coupled to receive the hypothesized first information bit, for modeling a first encoder and generating at least one encoded hypothesized first information bit; and means, coupled to receive the hypothesized second information bit, for modeling a second encoder and generating at least one encoded hypothesized second information bit.

8. The apparatus of claim 7, further comprising:

means, coupled to receive the at least one encoded hypothesized first information bit, for modeling the first transmitter and generating therefrom a first hypothesized modulated signal;

means, coupled to receive the at least one encoded hypothesized second information bit, for modeling the second transmitter and generating therefrom a second hypothesized modulated signal;

means for generating estimates of propagation path phase shift and attenuation experienced by each of the first and second modulated signals in propagating to the receiving means;

means for processing the hypothesized first modulated signal and the hypothesized second modulated signal by phase shifting and attenuating each by amounts specified by the estimates of propagation path phase shift and attenuation;

means for combining the processed hypothesized first and second modulated signals to produce an expected composite signal; and means for generating a composite signal prediction of complex values from the expected composite signal wherein, the means for processing the deinterleaved complex numerical samples and the encoded bit-pair sequences to generate for each of the bit-pair sequences the path metric indicative of the likelihood that the corresponding hypothesized sequence of information bit-pairs is the correct hypothesis comprises:

means for generating a delta metric by comparing the composite signal prediction with the deinterleaved complex numerical sample, wherein the delta metric is indicative of the likelihood that the composite signal prediction is a correct prediction; and joint maximum likelihood sequence estimator means for accumulating the delta metrics to determine, for each hypothesized bit-pair sequence, the path metric indicative of the likelihood that the associated bit-pair sequence is the correct hypothesis.

9. The apparatus of claim 6, wherein the means for processing the composite signal to generate the soft samples comprises means for amplifying, downconverting, filtering and analog-to-digital converting the composite signal.

* * * * *